United States Patent
Ito

(10) Patent No.: US 11,366,487 B2
(45) Date of Patent: Jun. 21, 2022

(54) RESETTING CLOCK DIVIDER CIRCUITRY PRIOR TO A CLOCK RESTART

(71) Applicant: MICRON TECHNOLOGY, INC., Boise, ID (US)

(72) Inventor: Koji Ito, Sagamihara (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/067,247

(22) Filed: Oct. 9, 2020

(65) Prior Publication Data
US 2021/0026398 A1 Jan. 28, 2021

Related U.S. Application Data

(62) Division of application No. 16/373,229, filed on Apr. 2, 2019, now Pat. No. 10,802,535.

(51) Int. Cl.
| | |
|---|---|
| *H03K 21/38* | (2006.01) |
| *G06F 1/10* | (2006.01) |
| *H03K 23/66* | (2006.01) |
| *G11B 20/10* | (2006.01) |

(52) U.S. Cl.
CPC .......... *G06F 1/10* (2013.01); *G11B 20/10009* (2013.01); *H03K 21/38* (2013.01); *H03K 23/667* (2013.01)

(58) Field of Classification Search
CPC .... G06F 1/10; G06F 1/08; G06F 1/06; H03K 23/667; H03K 23/54; H03K 21/38; G11B 20/10009
See application file for complete search history.

(56) References Cited

U.S. PATENT DOCUMENTS

| | | | |
|---|---|---|---|
| 6,463,013 B1 | 10/2002 | Liu et al. | |
| 7,352,644 B2 * | 4/2008 | Lee | G11C 7/20 365/230.06 |
| 2010/0102868 A1 * | 4/2010 | Kim | H03M 1/109 327/291 |
| 2014/0145764 A1 * | 5/2014 | Lee | H03K 5/15066 327/142 |

OTHER PUBLICATIONS

U.S. Appl. No. 16/373,229, titled "Resetting Clock Divider Circuitry Prior to a Clock Restart", filed Apr. 2, 2019.

* cited by examiner

*Primary Examiner* — Sibin Chen
(74) *Attorney, Agent, or Firm* — Dorsey & Whitney LLP

(57) ABSTRACT

A divider and buffer circuit uses a receive command to initiate a reset of buffer circuitry prior to restarting to avoid a metastable state. For example, the divider and buffer circuit includes a first buffer circuit, a second buffer circuit, and a reset circuit. The reset circuit receives a command and provide a pulse on a reset signal in response to the command. In response to the reset pulse, the first buffer circuit provides a first divided clock signal having a first logical value based on respective logical values of received complementary clock signals and the second buffer circuit provides a second divided clock signal having a second logical value based on the respective logical values of the complementary clock signals. The command is a CAS SYNC command, in some examples.

18 Claims, 6 Drawing Sheets

RESETTING CLOCK DIVIDER CIRCUITRY PRIOR TO A CLOCK RESTART

CROSS REFERENCE TO RELATED APPLICATION(S)

This application is a divisional of U.S. patent application Ser. No. 16/373,229 filed Apr. 2, 2019, issued as U.S. Pat. No. 10,802,535 on Oct. 13, 2020. The aforementioned application and patent are incorporated herein by reference, in their entirety, for any purpose.

BACKGROUND OF THE INVENTION

High data reliability, high speed of memory access, low power, and reduced chip size are features that are demanded from semiconductor memory. Within a memory, some clock generators and clock dividers may become inactive when the generated clock signals are not being used (e.g., between memory accesses) in order to conserve power. The clock generator and clock dividers may be controlled to be enabled just before receiving the read and write operations, and should be able to provide stable clock signals within a predetermined period of time. With high speed communications, the window to stabilize clock signals may be narrow, and a failure to stabilize clock signals before within this window may reduce reliability of the memory to receive data.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Some of the material described in this disclosure includes devices and techniques for resetting clock input circuits and divider circuits prior to beginning write operations in a memory device. For example, many memory devices, such as double data rate (DDR) DRAM devices, including DDR4, DDR5, low power DDR5 (LPDDR5), graphics DDR (GDDR) DRAM devices, include circuitry to perform read and write operations. Many different clock signals can be employed to allow the memory device to provide high performance reading and writing from and into the memory. In between write operations, clock input circuits and divider circuits may cease providing clock signals to downstream circuitry (e.g., input/output circuitry) to reduce power consumption. However, when restarting, the clock input circuits and divider circuits have a predetermined time window to reset to a known state, and to begin providing stable clock signals prior to data being received. Failing to complete these tasks within the predetermined time window may result in metastable clocks being used by the downstream circuitry to receive and process write data. One complication is that release of the reset signal for the divided clock circuitry should occur after the clock input circuitry output clocks are stable in their respective reset states. If the divider reset is released too soon, the divider clock circuit may start providing divided clock signals with unknown timing characteristics (e.g., metastable). Thus, the clock input and divider circuits may use receipt of a column access strobe (CAS) synchronization SYNC command to time provision and a length of a pulse on reset signals used to reset respective internal circuitry of the clock input and divider circuits. The CAS SYNC command is provided prior to receipt of a write command or a read command. Use of the CAS SYNC command to time provision and a length of a pulse on the reset signal within the divider clock circuit may mitigate provision of metastable divided clock signals.

Figure 1:
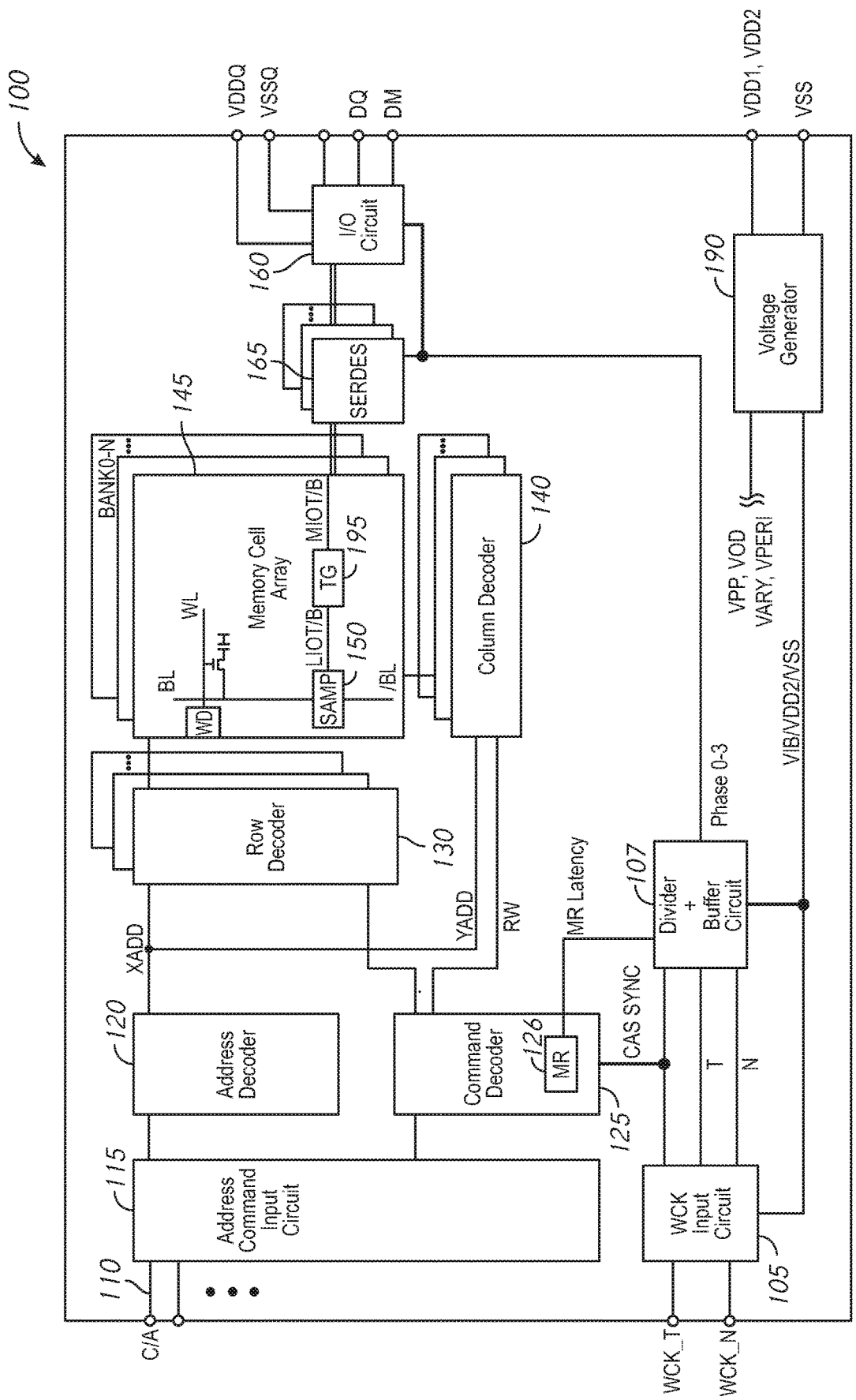
FIG. 1 is a schematic block diagram of a semiconductor device, in accordance with an embodiment of the present disclosure.

FIG. 1 is a schematic block diagram of a semiconductor device 100, in accordance with an embodiment of the present disclosure. The semiconductor device 100 may include a WCK input circuit 105, a divider and buffer circuit 107, an address/command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a serializer/deserializer (SERDES) circuitry 165, an input/output (I/O) circuit 160, and a voltage generator circuit 190. The semiconductor device 100 may include a plurality of external terminals including address and command terminals coupled to command/address bus 110, clock terminals CK and /CK, data terminals DQ, and DM, and power supply terminals VDD1, VDD2, VSS, VDDQ, and VSSQ. The semiconductor device may be mounted on a substrate, for example, a memory module substrate, a mother board or the like.

The memory cell array 145 includes a plurality of banks 0-N, with each bank 0-N including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers 152 are provided for their corresponding bit lines BL and coupled to at least one respective local I/O line further coupled to a respective one of at least two main I/O line pairs, via transfer gates TG 195, which function as switches. In some examples, the sense amplifiers 150 may include threshold voltage compensation circuitry configured to compensate for threshold voltage differences between components of the sense amplifier. Threshold voltage differences may exist due to process, voltage, and temperature (PVT) variance among various components.

The address/command input circuit 115 may receive an address signal and a bank address signal from outside (e.g., via a memory controller) at the command/address terminals via the command/address bus 110 and may transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may also receive command signals and chip select signals from outside (e.g., from the memory controller) at the command/address terminals via the command/address bus 110 and may provide the command signals and the chip select signals to the command decoder 125. The command signals may include various memory commands, such as access (e.g., read/write) commands. The chip select signals select the semiconductor device 100 to respond to commands and addresses provided to the command and address terminals. That is, in response to receipt of an active chip select signal at the semiconductor device 100, commands and addresses at the command/address terminals via the command/address bus 110 may be decoded to perform memory operations. The command decoder 125 may decode the command signals to generate various internal command signals. For example, the internal command signals may include a row command signal to select a word line, a column command signal, such as a read command or a write command, to select a bit line. The internal command signals can also include output and input activation commands, such as clocked command.

Accordingly, when a read command is issued and a row address and a column address are timely supplied with the read command, read data is read from a memory cell in the memory cell array 145 designated by the row address and the column address. The read command may be received by the command decoder 125. Read/write amplifiers of the SERDES circuitry 165 may receive the read data DQ and provide the read data DQ to the I/O circuit 160. The I/O circuit 160 may provide the read data DQ to outside via the data terminals DQ, together with a data mask signal at the data mask terminal DM. The read data may be provided at a time defined by read latency RL information that can be programmed in the semiconductor device 100, for example, in a mode register (not shown in FIG. 1). The read latency RL information RL may be defined in terms of clock cycles of the CK clock signal. For example, the read latency RL information may be defined as a number of clock cycles of the CK signal after the read command is received at the semiconductor device 100 when the associated read data is provided at an output via the data terminals DQ and DM.

Similarly, when the write command is issued and a row address and a column address are timely supplied with the write command, and then the I/O circuit 160 may receive write data at the data terminals DQ, together with a data mask DM signal and provide the write data via the read/write amplifiers of the SERDES circuitry 165. The SERDES circuitry 165 may provide the write data to the memory cell array 145. The write command may be received by the command decoder 125. Thus, the write data may be written in the memory cell designated by the row address and the column address. The write data and the data mask signal may be provided to the data terminals DQ and DM, respectively, at a time that is defined by write latency WL information. The write latency WL information may be programmed in the semiconductor device 100, for example, in the mode register (not shown in FIG. 1). The write latency WL information may be defined in terms of clock cycles of a clock signal CK. For example, the write latency WL information may be a number of clock cycles of the CK signal after receipt of the write command at the semiconductor device 100 when the associated write data and data mask signal are received at the data terminals DQ and DM.

Turning to the explanation of the external terminals included in the semiconductor device 100, the power supply terminals may receive power supply voltages VDD1, VDD2, and VSS. These power supply voltages VDD1, VDD2, and VSS may be supplied to a voltage generator circuit 190. The voltage generator circuit 190 may generate various internal voltages, VPP, VOD, VARY, VPERI, VIB, and the like based on the power supply voltages VDD1, VDD2, and VSS. Specifically, the internal voltage VIB may be generated using the VDD1 voltage. The internal voltage VIB may have a greater magnitude than the supply voltage VDD2. The internal voltage VPP is mainly used in the row decoder 130 and column decoder 140, the internal voltages VOD and VARY are mainly used in the sense amplifiers 150 included in the memory cell array 145, the internal voltage VIB (along with the power supply voltages VDD2 and VSS) is used in the WCK input circuit 105 and the divider and buffer circuit 107, and the internal voltage VPERI is used in many other circuit blocks. The I/O circuit 160 may receive the power supply voltages VDDQ and VSSQ. For example, the power supply voltages VDDQ and VSSQ may be the same voltages as the power supply voltages VDD1 and VSS, respectively. However, the dedicated power supply voltages VDDQ and VSSQ may be used for the I/O circuit 160.

The clock terminals WCK_T and WCK_N may receive an external clock signal WCK_T and a complementary external clock signal WCK_N, respectively. The WCK_T and WCK_N clock signals may be write clock signals, in some examples. The WCK_T and WCK_N clock signals may be supplied to a WCK input circuit 105. The WCK input circuit 105 may generate complementary internal clock signals T and N based on the WCK_T and WCK_N clock signals and a column access strobe (CAS) synchronization SYNC command. The WCK input circuit 105 may provide the T and N clock signals to the divider and buffer circuit 107. The divider and buffer circuit 107 may generate phase and frequency controlled internal clock signals PHASE0-3 based on the T and N clock signals T and N, the CAS SYNC command. The PHASE 0-3 clock signals may be phase shifted relative to one another by 90 degrees. For example, the PHASE 0 clock signal is phased-shifted 0 degrees relative to the internal clock signal T, the PHASE 1 clock signal is phased-shifted 90 degrees relative to the internal clock signal T, the PHASE 2 clock signal is phased-shifted 180 degrees relative to the internal clock signal T, and the PHASE 3 clock signal is phased-shifted 270 degrees relative to the internal clock signal T.

In some examples, provision of the WCK_T and WCK_N clock signals to the semiconductor device 100 from an external device (e.g., a memory controller) may stop (e.g., or be disabled) between write commands, such as when the time between consecutive write commands exceeds a predefined time limit. In response, the WCK input circuit 105 may disable (e.g., and/or cease provision of reliable versions of) the T and N clock signals during this time period when the WCK_T and WCK_N clock signals are disabled and/or are not being provided to the semiconductor device 100. Similarly, the divider and buffer circuit 107 may disable (e.g., and/or cease provision of reliable versions of) the PHASE 0-3 clock signals when the T and N clock signals are disabled. Prior to receipt of a write command following the WCK_T and WCK_N clock signals being disabled, the CAS SYNC command may be received at the semiconductor device 100. The CAS SYNC command may serve to notify the semiconductor device 100 that a write command and corresponding write data can be expected after a predefined amount of time defined by a CAS write latency. The CAS SYNC command may be responsive to a command clock signal CK (not shown). The command clock signal and the WCK_T and WCK_N clock signals may be asynchronous such that timing of the command clock signal may lead or lag timing of the WCK_T and WCK_N clock signals by up to half of the tCK.

Prior to operating in response to the restarted WCK_T and WCK_N clock signals, circuitry of the WCK input circuit 105 and/or the circuitry of the divider and buffer circuit 107 may be reset to a known state. Otherwise, one or both of the WCK input circuit 105 and/or the divider and buffer circuit 107 may be operating in a metastable state where timing of the T and N clock signals and/or the PHASE 0-3 clock signals is unreliable. For example, the T clock signal and the PHASE 0-1 clock signals may be reset to a logical low state and the N clock signal and the PHASE 2-3 clock signals may be reset to a logical high state. Other reset states may be realized without departing from the scope of the disclosure.

The WCK input circuit 105 and the divider and buffer circuit 107 initiate respective reset operations in response to receipt of the CAS SYNC signal. Because the divider and buffer circuit 107 operates downstream of (e.g., in response to the T and N clock signals provided by) the WCK input circuit 105, completion of the reset operation associated with the divider and buffer circuit 107 may follow completion of the reset operation associated with the WCK input circuit 105. The subsequent completion of the reset operation associated with the divider and buffer circuit 107 may mitigate an opportunity for the divider and buffer circuit 107 to operate in a metastable state based on spurious voltages provided on the T and N clock signals. The reset operation associated with the divider and buffer circuit 107 may include providing a pulse on a reset signal to circuitry of the divider and buffer circuit 107. The start time of the pulse may be based on receipt of the CAS SYNC signal and an end time of the pulse may be based on the nCK of the command clock CK signal defined by a reset pulse end time setting. In some examples, pulse signal end time settings corresponding to each of one or more tCK values of the divider and buffer circuit 107 may be stored in a table in a mode register 126 of the command decoder 125 of the semiconductor device 100 and may be provided to the divider and buffer circuit 107 as a mode register (MR) latency signal, and a particular pulse signal end time setting may be selected based on the tCK of the command clock CK signal. Basing timing of the reset operation of the divider and buffer circuit 107 on receipt of the CAS SYNC command may mitigate the divider and buffer circuit 107 operating in a metastable state.

After completion of the respective reset operations, the WCK input circuit 105 may provide the T and N clock signals in response to the WCK_T and WCK_N clock signals, and the divider and buffer circuit 107 may provide the PHASE 0-3 clock signals in response to the T and N clock signals.

The divider and buffer circuit 107 may provide the PHASE 0-3 clock signals to the SERDES circuitry 165 and to the I/O circuit 160. The SERDES circuitry 165 may support high speed read and write operations by deserializing high speed write data and serializing high speed read data. For example, during a high speed write operation, the I/O circuit 160 may receive and buffer (e.g., via input buffers) serialized write data in response to the PHASE 0-3 clock signals. The SERDES circuitry 165 may be configured to retrieve the serialized write data from the input buffers of the I/O circuit 160 responsive to the PHASE 0-3 clock signals, and deserialize the serialized write data (e.g., make it parallel) to provide deserialized write data. The SERDES circuitry 165 may provide the deserialized write data to memory cell array 145. Thus, during a high speed write operation, data is received at I/O circuit 160 via the data terminals DQ and is deserialized using the SERDES circuitry 165 using the PHASE 0-3 clock signals.

Additionally, during a high speed read operation, deserialized read data may be received from the memory cell array 145, and the SERDES circuitry 165 may be configured to serialize the deserialized read data responsive to a read clock signal (not shown) to provide serialized read data. The SERDES circuitry 165 may provide the serialized read data to the I/O circuit 160 responsive to the read clock signal. The read clock signals may be used by transceivers of the SERDES circuitry 165 to support the high speed read operations to serialize the deserialized read data received from the memory cell array 145. That is, the SERDES circuitry 165 may serialize the deserialized read data based on timing of the read clock signals provide the serialized read data.

Figure 2:
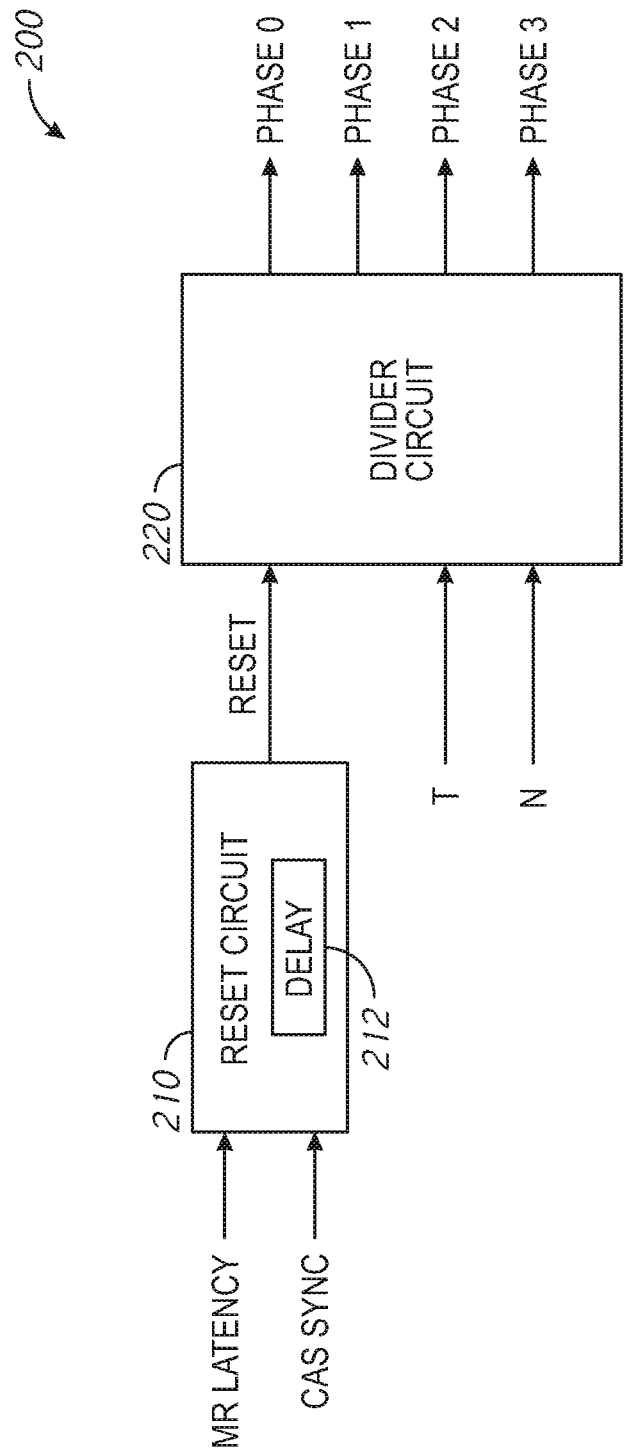
FIG. 2 is a block diagram of part of a divider and buffer circuit in accordance with an embodiment of the disclosure.

FIG. 2 is a block diagram of a divider and buffer circuit 200 in accordance with an embodiment of the disclosure. The divider and buffer circuit 200 may include a reset circuit 210 and a divider circuit 220. The divider and buffer circuit 107 of FIG. 1 may implement the divider and buffer circuit 200, in some examples. The reset circuit 210 may be configured to reset the divider circuit 220 based on a CAS SYNC command and the divider circuit 220 may be configured to generate frequency and phase shifted clock signals PHASE 0-3 based on received complementary (e.g., phase-shifted 180 relative to one another) clock signals T and N.

The reset circuit 210 may be configured to initiate a reset of the divider circuit 220 via a reset signal during a reset operation in response to the CAS SYNC command. The CAS SYNC command may be provided by a command decoder, such as the command decoder 125 of FIG. 1. During the reset operation, the reset circuit 210 may provide a pulse on the reset signal. The duration of the pulse may be measured from a start time based on receipt of the CAS SYNC command and an end time (e.g., a time at which the pulse is terminated) based on a reset pulse end time setting. The reset pulse end time setting may be retrieved from a table of a mode register (e.g., the mode register 126 of FIG. 1) and may be based on a time period (e.g., or frequency) of a command clock signal. The reset pulse end time setting may be indicated as a number of the tCK cycles nCK of the command clock CK signal measured from the start time. In some examples, the reset pulse end time setting may include a set to values ranging from 0.5 nCK to 3.5 nCK. For example, if a maximum tCK of the command clock is 200 nanoseconds, then the reset pulse end time value may be set to 0.5 nCK. In another example, if the maximum tCK of the command clock is 1.67 nanoseconds, then the reset pulse end time value may be set to 3.5 nCK. Other nCK values and ranges may be used without departing from the scope of the disclosure. In some examples, the reset circuit 210 may include a delay circuit 212 to extend the reset pulse end time by a delay amount. The delay provided by the delay circuit 212 may be an asynchronous delay. In some examples, the delay circuit 212 may include inverters or other components to provide the additional delay. The delay provided by the delay circuit 212 may mitigate effects of the asynchronous timing relationship between the command clock and write clocks on which timing of the T and N clock signals are based (e.g., the WCK_T and WCK_N clock signals of FIG. 1).

The divider circuit 220 may receive the T and N clock signals (e.g., from a write clock input circuit, such as the WCK 105 of FIG. 1) and may divide the T and N clock signals to provide the PHASE 0-3 clock signals. The PHASE 0-3 clock signals may have a frequency that is half of a frequency of the T and N clock signals, and may be phase shifted relative to one another by 90 degrees. For example, the PHASE 0 clock signal may be phased-shifted 0 degrees relative to the T clock signal T, the PHASE 1 clock signal may be phased-shifted 90 degrees relative to the T clock signal, the PHASE 2 clock signal may be phased-shifted 180 degrees relative to the T clock signal, and the PHASE 3 clock signal may be phased-shifted 270 degrees relative to the T clock signal. The PHASE 0-3 clock signals may be provided to I/O circuitry to receive and buffer write data received via data terminals in input buffers, and/or to deserialize received write data for storing in a memory cell array in a write operation. Furthermore, the PHASE 0-3 clock signals may be provided to I/O circuitry to serialize read data transferred from the memory cell array, and/or to output serialized read data to outside in a read operation. The divider circuit 220 may also receive the reset signal. In response to a pulse on the reset signal, the circuitry of the divider circuit 220 may cause the PHASE 0-3 clock signals to be set to respective predefined logical high or low logical values (e.g., rather than having values based on the T and N clock signals). When the pulse on the reset signal ends, the circuitry of the divider circuit 220 may return to provision of the PHASE 0-3 clock signals in response to the T and N clock signals.

In operation, the divider circuit 220 may be configured to generate frequency and phase shifted clock signals PHASE 0-3 based on received complementary (e.g., phase-shifted 180 relative to one another) clock signals T and N. In some scenarios, provision of the WCK_T and WCK_N clock signals on which the T and N clock signals are based may be disabled between write commands, such as when the time between consecutive write commands exceeds a predefined time limit. In response, the T and N clock signals may become disabled or unreliable during this time period. Accordingly, the divider circuit 220 may disable (e.g., and/or cease provision of reliable versions of) the PHASE 0-3 clock signals when the T and N clock signals are disabled or unreliable. Prior to receipt of a write command after the PHASE 0-3 clock signals are disabled or become unreliable, the CAS SYNC command may be received. The CAS SYNC command may serve to notify the reset circuit 210 that a write command and corresponding write data can be expected after a predefined amount of time defined by a CAS write latency. The CAS SYNC command may be received responsive to the command clock CK signal (not shown). Because a state of circuitry of the divider circuit 220 is unknown and unreliable, the reset circuit 210 may initiate a reset operation of the circuitry of the divider circuit 220 in response to receipt of the CAS SYNC command.

During the reset operation, the reset circuit 210 may provide a pulse on the reset signal with having a duration defined by a start time (e.g., time when the pulse is initiated) determined in response to receipt of the CAS SYNC command and an end time (e.g., time when the pulse terminates) based on the reset pulse end time setting. The reset pulse end time setting may be defined as an nCK of the command clock CK signal measured from the start time of the reset pulse. The reset pulse end time setting may be retrieved from a mode register (e.g., the mode register 126 of FIG. 1) or may be fixed. In some examples, the reset pulse end time setting may be further extended based on a delay of a delay circuit 212. The delay provided by the delay circuit 212 may mitigate effects of the asynchronous timing relationship between the command clock and write clocks on which timing of the T and N clock signals are based. In some examples, the delay provided by the delay circuit 212 is an asynchronous delay relative to timing of any clock signals.

In response to receipt of the pulse on the reset signal, the circuitry of the divider circuit 220 may cause the PHASE 0-3 clock signals to be set to respective predefined logical high or low logical values (e.g., rather than having values based on the T and N clock signals). For example, the PHASE 0-1 clock signals may be set to low logical values and the PHASE 2-3 clock signals may be set to high logical values. When the pulse on the reset signal ends (e.g., after the reset pulse end time), the circuitry of the divider circuit 220 may return to provision of the PHASE 0-3 clock signals in response to the T and N clock signals. Thus, the divider circuit 220 may divide the T and N clock signals to provide the PHASE 0-3 clock signals having a different phase and/or frequency than the T and N clock signals. In some examples, logical values of the T and N clock signals may be based on an internal voltage VIB and a source voltage VSS, and logical values of the PHASE 0-3 clock signals may be based on source voltages VDD2 and VSS.

Basing timing of the reset operation of the divider circuit 220 on receipt of the CAS SYNC command and on the tCK of the command clock signal may reduce a likelihood the divider circuit 220 operates in a metastable (e.g., unreliable/unknown timing) state.

Figure 3:
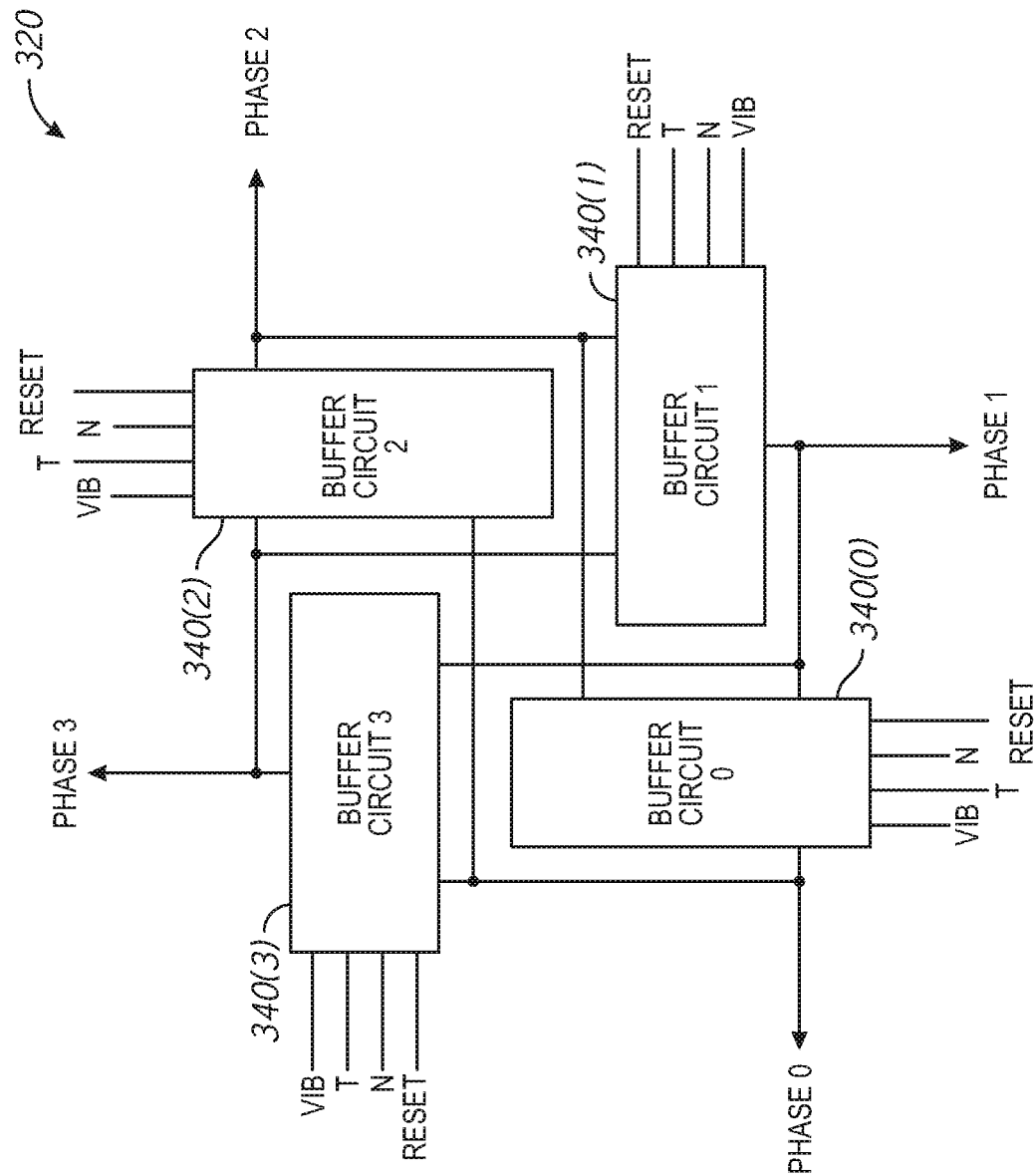
FIG. 3 is a block diagram of part of a divider circuit in accordance with an embodiment of the disclosure.

FIG. 3 is a block diagram of part of a divider circuit 320 in accordance with an embodiment of the disclosure. The divider circuit 320 may include buffer circuits 340(0)-(3) configured to provide PHASE 0-3 clock signals. The divider and buffer circuit 107 of FIG. 1 and/or the divider circuit 220 of FIG. 2 may implement the divider circuit 320, in some examples.

Each of the buffer circuits 340(0)-(3) may be configured to receive the T and N clock signals (e.g., from a write clock input circuit, such as the WCK 105 of FIG. 1), an internal voltage VIB, and a reset signal. Each of the buffer circuits 340(0)-(3) may be configured to provide a respective one of inverted, frequency-divided, and phase-shifted PHASE 0-3 clock signals. In some examples, each of the buffer circuits 340(0)-(3) may include one or more tri-state inverters. The PHASE 0-3 clock signals may each have a frequency that is half of a frequency of the T and N clock signals, and they may each be phase shifted relative to one another by 90 degrees. For example, the PHASE 0 clock signal may be phased-shifted 0 degrees relative to the T clock signal T, the PHASE 1 clock signal may be phased-shifted 90 degrees relative to the T clock signal, the PHASE 2 clock signal may be phased-shifted 180 degrees relative to the T clock signal, and the PHASE 3 clock signal may be phased-shifted 270 degrees relative to the T clock signal. The PHASE 0-3 clock signals may be provided to I/O circuitry to receive and buffer write data received via data terminals in input buffers, and/or to deserialize received write data for storing in a memory cell array.

To maintain relative transition timing between the PHASE 0-3 clock signals, each of the buffer circuits 340(0)-(3) may include circuitry to provide the respective PHASE 0-3 clock signal based on transitions (e.g., from a high logical value to a low logical value or from the low logical value to the high logical value) of others of the PHASE 0-3 clock signals (in addition to values of the T and N clock signals). For example, the buffer circuit 340(0) may provide the PHASE 0 clock signal having transition timing based on transitions of the PHASE 1 and PHASE 2 clock signals. The buffer circuit 340(1) may provide the PHASE 1 clock signal having transition timing based on transitions of the PHASE 2 and PHASE 3 clock signals. The buffer circuit 340(2) may provide the PHASE 2 clock signal having transition timing based on transitions of the PHASE 3 and PHASE 0 clock signals. The buffer circuit 340(3) may provide the PHASE 3 clock signal having transition timing based on transitions of the PHASE 0 and PHASE 1 clock signals.

In addition, during a reset operation, each of the buffer circuits 340(0)-(3) may cause a respective one of the PHASE 0-3 clock signals to be set to a respective predefined logical high or low logical value (e.g., rather than having values based on the T and N clock signals) in response to a reset pulse on the reset signal. For example, during a reset operation, the buffer circuit 340(0) may cause the PHASE 0 clock signal to be set to the low logical value, the buffer circuit 340(1) may cause the PHASE 1 clock signal to be set to the low logical value, the buffer circuit 340(2) may cause the PHASE 2 clock signal to be set to the high logical value, and the buffer circuit 340(3) may cause the PHASE 3 clock signal to be set to the high logical value. Resetting the PHASE 0-3 clock signals to known logical values during a reset operation may reduce a likelihood the divider circuit 320 operates in a metastable (e.g., unreliable/unknown timing) state.

In operation, each of the buffer circuits 340(0)-(3) may be configured to generate the PHASE 0-3 clock signals based on the received complementary (e.g., phase-shifted 180 relative to one another) T and N clock signals and based on transitions of others of the PHASE 0-3 clock signals. In some scenarios, provision of the WCK_T and WCK_N clock signals on which the T and N clock signals are based may be disabled between write commands, such as when the time between consecutive write commands exceeds a predefined time limit. In response, the T and N clock signals may become disabled or unreliable during this time period. Accordingly, the divider circuit 320 may continue to operate to provide the PHASE 0-3 clock signals based on the unreliable/disabled T and N clock signals. Further, when the T and N clock signals are re-enabled, the divider circuit 320 may be in an unknown state such that the timing of the PHASE 0-3 clock signals is unknown. Prior to receipt of a write command after the PHASE 0-3 clock signals are disabled or become unreliable, the CAS SYNC command may be received. The CAS SYNC command may serve to notify the reset circuit 210 that a write command and corresponding write data can be expected after a predefined amount of time defined by a CAS write latency. The CAS SYNC command may be received responsive to the command clock CK signal (not shown). Because a state of circuitry of the divider circuit 320 is unknown and unreliable, a reset operation may be initiated in response to receipt of the CAS SYNC command.

During the reset operation, a pulse may be provided on the reset signal with a start time defined based on receipt of the CAS SYNC command and the end time of the pulse based on the reset pulse end time. The reset pulse end time may be defined as an nCK of the command clock CK signal measured from the clock cycle associated with the reset pulse start time. The reset pulse end time value may be retrieved from a mode register (e.g., the mode register 126 of FIG. 1) or may be fixed In response to receipt of the pulse on the reset signal, each of the buffer circuits 340(0)-(3) may be configured to cause the PHASE 0-3 clock signals to be set to respective predefined logical high or low logical values (e.g., rather than having values based on the T and N clock signals). For example, the PHASE 0-1 clock signals may be set to low logical values and the PF2-3 clock signals may be set to high logical values. When the pulse on the reset signal ends (e.g., after the reset pulse end time), each of the buffer circuits 340(0)-(3) may return to provision of the PHASE 0-3 clock signals in response to the T and N clock signals. Thus, the buffer circuits 340(0)-(3) may divide the T and N clock signals to provide the PHASE 0-3 clock signals having a different phase and/or frequency than the T and N clock signals. In some examples, logical values of the T and N clock signals may be based on an internal voltage VIB and a source voltage VSS, and logical values of the PHASE 0-3 clock signals may be based on source voltages VDD2 and VSS.

Basing timing of the reset operation of the divider circuit 320 on receipt of the CAS SYNC command and on the tCK of the command clock signal may mitigate the divider circuit 320 operating in a metastable (e.g., unknown and/or unreliable relative timing) state.

FIGS. 4A-4D are schematic diagrams of buffer circuits 440(0)-(3), respectively, in accordance with an embodiment of the disclosure. The divider and buffer circuit 107 of FIG. 1, the divider circuit 220 of FIG. 2, and/or the divider circuit 320 of FIG. 3 may implement the buffer circuits 440(0)-(3) of FIGS. 4A-4D.

Figure 4A:
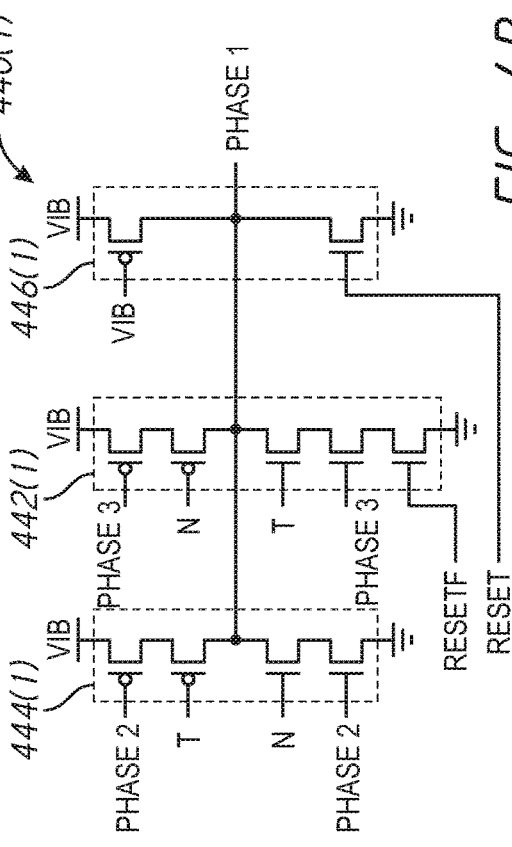
FIGS. 4A-4D are schematic diagrams of buffer circuits in accordance with an embodiment of the disclosure.

Turning now to FIG. 4A, the buffer circuit 440(0) may include a first inverter 442(0), a second inverter 444(0), and a reset inverter 446(0) each coupled to a common output node configured to provide the PHASE 0 clock signal. The first inverter 442(0) includes four serially-coupled transistors coupled between an internal voltage VIB and a source voltage VSS, including (e.g., in order from the VIB voltage to the VSS voltage) a p-type transistor controlled by (e.g., received at a gate) a PHASE 1 clock signal from the buffer circuit 440(1), a p-type transistor controlled by a N clock signal, an n-type transistor controlled by an T clock signal, and an n-type transistor controlled by the PHASE 1 clock signal. The common output node is coupled to the first inverter 442(0) between the p-type transistor controlled by the N clock signal and the n-type transistor controlled by the T clock signal.

The second inverter 444(0) includes five serially-coupled transistors coupled between the VIB voltage and the VSS voltage, including (e.g., in order from the VIB voltage to the VSS voltage) a p-type transistor controlled by a PHASE 2 clock signal from the buffer circuit 440(2), a p-type transistor controlled by the T clock signal, an n-type transistor controlled by the N clock signal, an n-type transistor controlled by the PHASE 2 clock signal, and an n-type transistor controlled by an active-low reset signal RESETF. The common output node is coupled to the second inverter 444(0) between the p-type transistor controlled by the T clock signal and the n-type transistor controlled by the N clock signal.

The reset inverter 446(0) includes two serially-coupled transistors coupled between the VIB voltage and the VSS voltage, including (e.g., in order from the VIB voltage to the VSS voltage) a p-type transistor controlled by the VIB voltage (e.g., always disabled or off), and an n-type transistor controlled by an active-high reset signal RESET. The common output node is coupled to the reset inverter 446(0) between the p-type transistor and the n-type transistor. The reset inverter 446(0) may include both the p-type transistor and the n-type transistor to provide equivalent capacitance values the output node of each of the buffer circuits 440(0)-(3).

In normal operation, the buffer circuit 440(0) is configured to drive the PHASE 0 signal in response to the T and N clock signals and the PHASE 1 and PHASE 2 clock signals. When the T clock signal has a low logical value and the N clock signal has a high logical value, the first inverter 442(0) is disabled and the second inverter 444(0) is enabled to provide the PHASE 0 clock signal in response to the PHASE 2 clock signal. When the T clock signal has the high logical value and the N clock signal has the low logical value, the second inverter 444(0) is disabled and the first inverter 442(0) is enabled to provide the PHASE 0 clock signal in response to the PHASE 1 clock signal.

During a reset operation, the second inverter 444(0) is enabled and the first inverter 442(0) is disabled via the T and N clock signals having logical low and high values, respectively. In addition, the pull-down portion of the second inverter 444(0) is disabled in response to a pulse provided on the RESETF signal having the low logical value to prevent leakage current. The RESET signal transition to a high logical value to enable the pull-down portion of the reset inverter 446(0). The PHASE 2 clock signal may be driven to the high logical value via the buffer circuit 440(2). In response, the second inverter 444(0) is configured to drive the PHASE 0 to a low logical value during the reset operation.

Figure 4B:
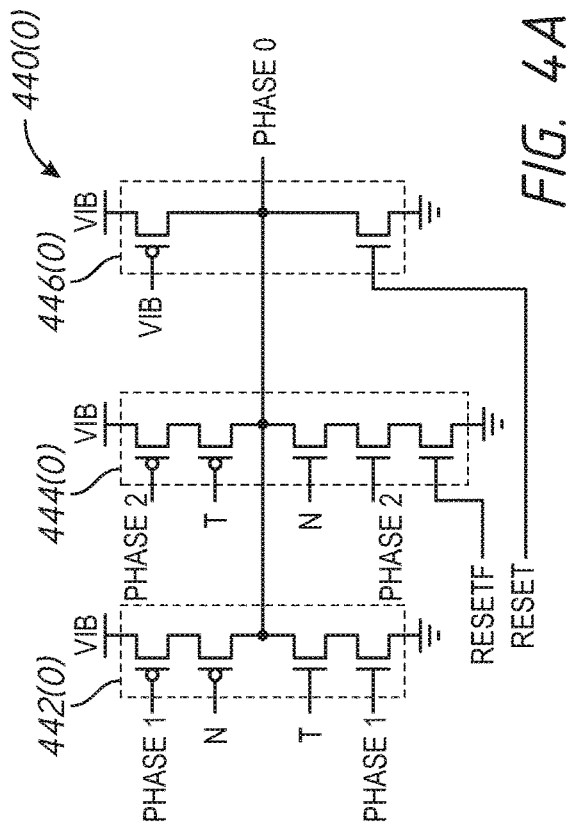

Turning now to FIG. 4B, the buffer circuit 440(1) may include a first inverter 442(1), a second inverter 444(1), and a reset inverter 446(1) each coupled to a common output node configured to provide the PHASE 1 clock signal. The second inverter 444(1) includes four serially-coupled transistors coupled between an internal voltage VIB and a source voltage VSS, including (e.g., in order from the VIB voltage to the VSS voltage) a p-type transistor controlled by (e.g., received at a gate) the PHASE 2 clock signal from the buffer circuit 440(2), a p-type transistor controlled by the T clock signal, an n-type transistor controlled by the N clock signal, and an n-type transistor controlled by the PHASE 2 clock signal. The common output node is coupled to the second inverter 444(1) between the p-type transistor controlled by the T clock signal and the n-type transistor controlled by the N clock signal.

The first inverter 442(1) includes five serially-coupled transistors coupled between the VIB voltage and the VSS voltage, including (e.g., in order from the VIB voltage to the VSS voltage) a p-type transistor controlled by a PHASE 3 clock signal from the buffer circuit 440(3), a p-type transistor controlled by the N clock signal, an n-type transistor controlled by the T clock signal, an n-type transistor controlled by the PHASE 3 clock signal, and an n-type transistor controlled by the RESETF signal. The common output node is coupled to the first inverter 442(1) between the p-type transistor controlled by the N clock signal and the n-type transistor controlled by the T clock signal.

The reset inverter 446(1) includes two serially-coupled transistors coupled between the VIB voltage and the VSS voltage, including (e.g., in order from the VIB voltage to the VSS voltage) a p-type transistor controlled by the VIB voltage (e.g., always disabled or off), and an n-type transistor controlled by the RESET signal. The common output node is coupled to the reset inverter 446(1) between the p-type transistor and the n-type transistor. The reset inverter 446(1) may include both the p-type transistor and the n-type transistor to provide equivalent capacitance values the output node of each of the buffer circuits 440(0)-(3).

In normal operation, the buffer circuit 440(1) is configured to drive the PHASE 1 signal in response to the T and N clock signals and the PHASE 2 and PHASE 3 clock signals. When the T clock signal has a low logical value and the N clock signal has a high logical value, the first inverter 442(1) is disabled and the second inverter 444(1) is enabled to provide the PHASE 1 clock signal in response to the PHASE 2 clock signal. When the T clock signal has the high logical value and the N clock signal has the low logical value, the second inverter 444(1) is disabled and the first inverter 442(1) is enabled to provide the PHASE 1 clock signal in response to the PHASE 3 clock signal.

During a reset operation, the second inverter 444(1) is enabled and the first inverter 442(1) is disabled via the T and N clock signals having logical low and high values, respectively. In addition, the pull-down portion of the first inverter 442(1) is disabled in response to a pulse provided on the RESETF signal having the low logical value to prevent leakage current. The RESET signal transitions to a high logical value to enable the pull-down portion of the reset inverter 446(1). The PHASE 2 clock signal is driven to the high logical value via the buffer circuit 440(2). In response, the second inverter 444(1) is configured to drive the PHASE 1 to the low logical value during the reset operation.

Figure 4C:
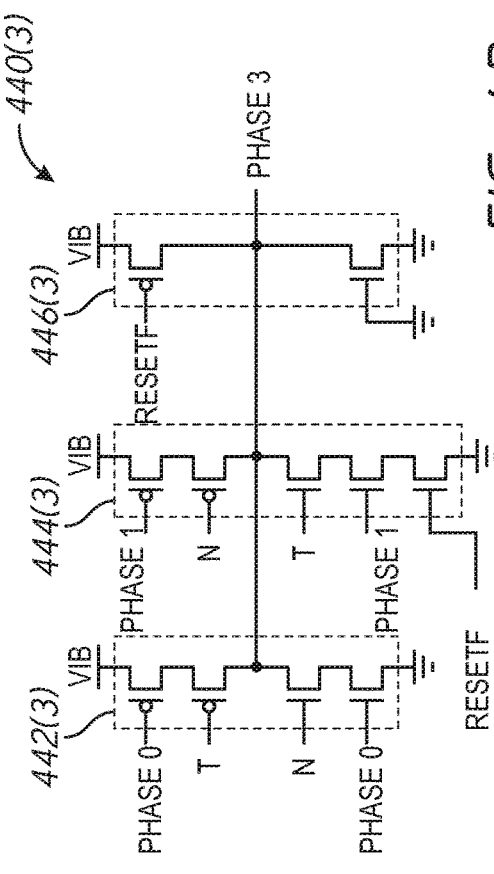

Turning now to FIG. 4C, the buffer circuit 440(2) may include a first inverter 442(2), a second inverter 444(2), and a reset inverter 446(2) each coupled to a common output node configured to provide the PHASE 2 clock signal. The second inverter 444(2) includes four serially-coupled transistors coupled between an internal voltage VIB and a source voltage VSS, including (e.g., in order from the VIB voltage to the VSS voltage) a p-type transistor controlled by (e.g., received at a gate) the PHASE 3 clock signal from the buffer circuit 440(3), a p-type transistor controlled by the N clock signal, an n-type transistor controlled by the T clock signal, and an n-type transistor controlled by the PHASE 3 clock signal. The common output node is coupled to the second inverter 444(2) between the p-type transistor controlled by the N clock signal and the n-type transistor controlled by the T clock signal.

The first inverter 442(2) includes five serially-coupled transistors coupled between the VIB voltage and the VSS voltage, including (e.g., in order from the VIB voltage to the VSS voltage) a p-type transistor controlled by the PHASE 0 clock signal from the buffer circuit 440(0), a p-type transistor controlled by the T clock signal, an n-type transistor controlled by the N clock signal, an n-type transistor controlled by the PHASE 0 clock signal, and an n-type transistor controlled by the RESETF signal. The common output node is coupled to the first inverter 442(2) between the p-type transistor controlled by the T clock signal and the n-type transistor controlled by the N clock signal.

The reset inverter 446(2) includes two serially-coupled transistors coupled between the VIB voltage and the VSS voltage, including (e.g., in order from the VIB voltage to the VSS voltage) a p-type transistor controlled by the RESETF signal, and an n-type transistor controlled by a ground or reference voltage (e.g., always disabled or off). The common output node is coupled to the reset inverter 446(2) between the p-type transistor and the n-type transistor. The reset inverter 446(2) may include both the p-type transistor and the n-type transistor to provide equivalent capacitance values the output node of each of the buffer circuits 440(0)-(3).

In normal operation, the buffer circuit 440(2) is configured to drive the PHASE 2 signal in response to the T and N clock signals and the PHASE 0 and PHASE 3 clock signals. When the T clock signal has a low logical value and the N clock signal has a high logical value, the second inverter 444(2) is disabled and the first inverter 442(2) is enabled to provide the PHASE 2 clock signal in response to the PHASE 0 clock signal. When the T clock signal has the high logical value and the N clock signal has the low logical value, the first inverter 442(2) is disabled and the second inverter 444(2) is enabled to provide the PHASE 2 clock signal in response to the PHASE 3 clock signal.

During a reset operation, the first inverter 442(2) is enabled and the second inverter 444(2) is disabled via the T and N clock signals having logical low and high values, respectively. In addition, the pull-down portion of the first inverter 442(2) is disabled in response to a pulse provided on the RESETF signal having the low logical value to prevent leakage current. A pulse having a low logical value is provided on the RESET signal to enable the pull-up portion of the reset inverter 446(2) to couple the common output node to the VIB voltage. The PHASE 0 clock signal is driven to the low logical value via the buffer circuit 440(0). In response, the first inverter 442(2) and the reset inverter 446(2) are configured to drive the PHASE 2 to the high logical value during the reset operation.

Figure 4D:
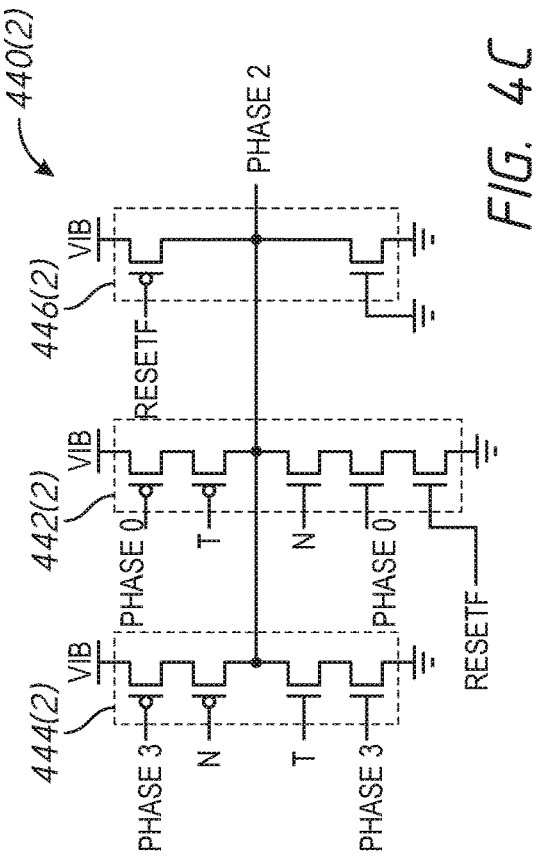

Turning now to FIG. 4D, the buffer circuit 440(3) may include a first inverter 442(3), a second inverter 444(3), and a reset inverter 446(3) each coupled to a common output node configured to provide the PHASE 3 clock signal. The first inverter 442(3) includes four serially-coupled transistors coupled between an internal voltage VIB and a source voltage VSS, including (e.g., in order from the VIB voltage to the VSS voltage) a p-type transistor controlled by (e.g., received at a gate) the PHASE 0 clock signal from the buffer circuit 440(0), a p-type transistor controlled by the T clock signal, an n-type transistor controlled by the N clock signal, and an n-type transistor controlled by the PHASE 0 clock signal. The common output node is coupled to the first inverter 442(3) between the p-type transistor controlled by the T clock signal and the n-type transistor controlled by the N clock signal.

The second inverter 444(3) includes five serially-coupled transistors coupled between the VIB voltage and the VSS voltage, including (e.g., in order from the VIB voltage to the VSS voltage) a p-type transistor controlled by the PHASE 1 clock signal from the buffer circuit 440(1), a p-type transistor controlled by the N clock signal, an n-type transistor controlled by the T clock signal, an n-type transistor controlled by the PHASE 1 clock signal, and an n-type transistor controlled by an active-low reset signal RESETF. The common output node is coupled to the second inverter 444(3) between the p-type transistor controlled by the N clock signal and the n-type transistor controlled by the T clock signal.

The reset inverter 446(3) includes two serially-coupled transistors coupled between the VIB voltage and the VSS voltage, including (e.g., in order from the VIB voltage to the VSS voltage) a p-type transistor controlled by an active-low reset signal, and an n-type transistor controlled by a ground or reference voltage (e.g., always disabled or off). The common output node is coupled to the reset inverter 446(3) between the p-type transistor and the n-type transistor. The reset inverter 446(3) may include both the p-type transistor and the n-type transistor to provide equivalent capacitance values the output node of each of the buffer circuits 440(0)-(3).

In normal operation, the buffer circuit 440(3) is configured to drive the PHASE 3 signal in response to the T and N clock signals and the PHASE 0 and PHASE 1 clock signals. When the T clock signal has a low logical value and the N clock signal has a high logical value, the second inverter 444(3) is disabled and the first inverter 442(3) is enabled to provide the PHASE 3 clock signal in response to the PHASE 0 clock signal. When the T clock signal has the high logical value and the N clock signal has the low logical value, the first inverter 442(3) is disabled and the second inverter 444(3) is enabled to provide the PHASE 3 clock signal in response to the PHASE 1 clock signal.

During a reset operation, the first inverter 442(3) is enabled and the second inverter 444(3) is disabled via the T and N clock signals having logical low and high values, respectively. In addition, the pull-down portion of the second inverter 444(3) is disabled in response to a pulse provided on the RESETF signal having the low logical value to prevent leakage current. A pulse having a low logical value is provided on the RESETF signal to enable the pull-up portion of the reset inverter 446(3) to couple the common output node to the VIB voltage. The PHASE 0 clock signal is driven to the low logical value via the buffer circuit 440(0). In response, the first inverter 442(3) and the reset inverter 446(3) are configured to drive the PHASE 3 to the high logical value during the reset operation.

Thus, in summary, during normal operation, when the T clock signal has a low logical value and the N clock signal has a high logical value, the first inverters 442(0)-(1) and the second inverters 444(2)-(3) are disabled and the second inverters 444(0)-(1) and the first inverters 442(2)-(3) are enabled to provide the PHASE 0-3 clock signals. When the T clock signal has the high logical value and the N clock signal has the low logical value, the second inverters 444(0)-(1) and the first inverters 442(2)-(3) are disabled and the first inverters 442(0)-(1) and the second inverters 444(2)-(3) are enabled to provide the PHASE 0-3 clock signals. In some examples, the first inverters 442(0)-(3) and the second inverters 444(0)-(3) may include tri-state inverters.

During the reset operation, the buffer circuits 440(0)-(1) are configured to drive the PHASE 0-1 clock signals to low logical values in response to the T and N clock signals, the RESET signal, and the RESETF signal, and the buffer circuits 440(2)-(3) are configured to drive the PHASE 2-3 clock signals to high logical values in response to the T and N clock signals and the RESETF signal.

Figure 5:
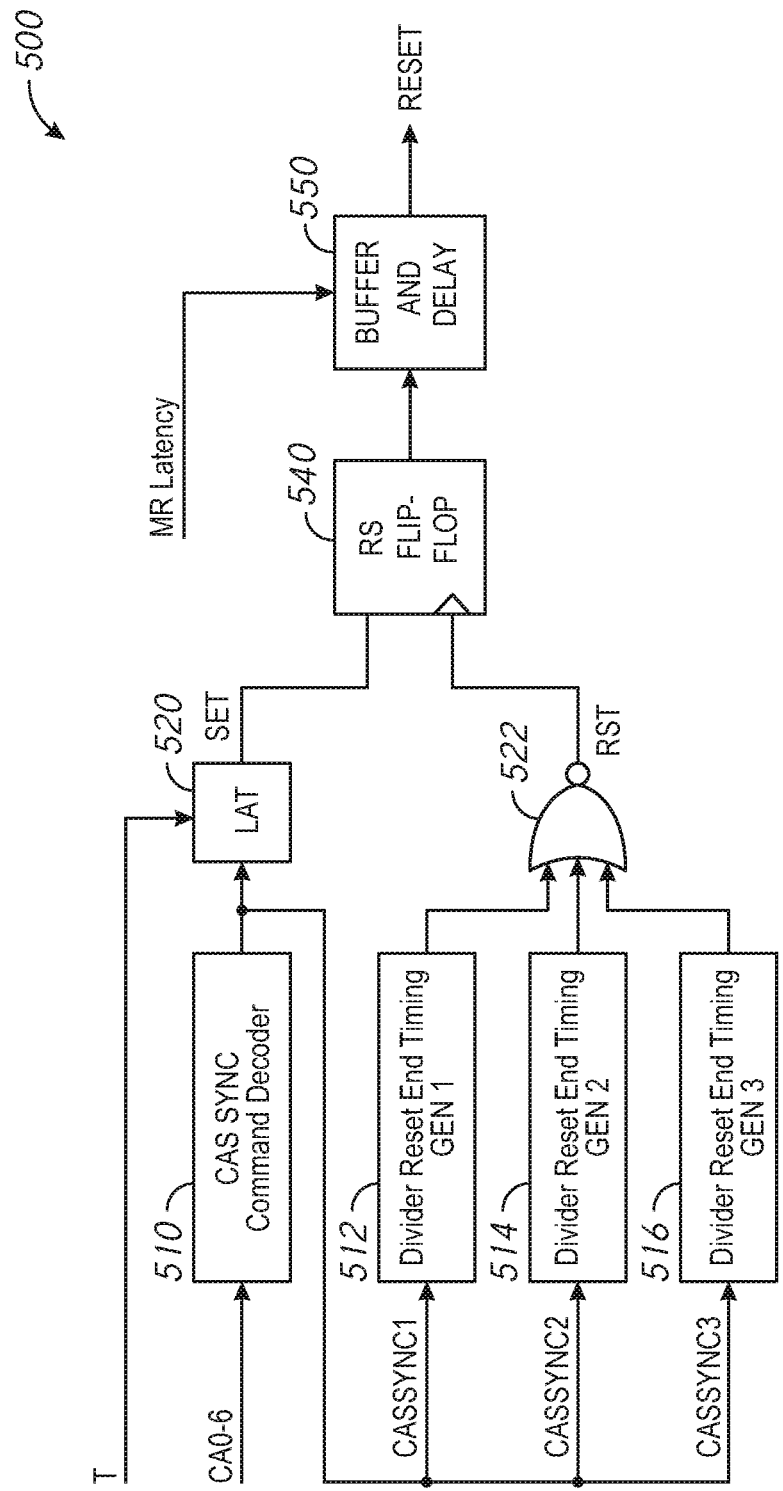
FIG. 5 is a block diagram of a command decoder and a reset circuit in accordance with an embodiment of the disclosure.

FIG. 5 is a block diagram of a command decoder 510 and a reset circuit 500 in accordance with an embodiment of the disclosure. The reset circuit 500 may include a first reset end timing generator 512, a second reset end timing generator 514, a third reset end timing generator 516, a 522, a 540, and a 550. The command decoder 125 of FIG. 1 may implement the command decoder 510 and/or the divider and buffer circuit 107 of FIG. 1 and/or the reset circuit 210 of FIG. 2 may implement the reset circuit 500, in some examples. The reset circuit 500 may be configured to reset a divider circuit based on a CAS SYNC command.

The command decoder 510 may be configured to decode a command signal CA0-6 to determine whether the command signal CA0-6 includes a CASSYNC command, as well as a type (e.g., CASSYNC1, CASSYNC2, or CASSYNC3) of CASSYNC command. In response to detection of a CASSYNC1, CASSYNC2, or CASSYNC3 command, the command decoder 510 may provide a signal to the latch 520 and to the first reset end timing generator 512, the second reset end timing generator 514, and the third reset end timing generator 516 of the reset circuit. Each of the first reset end timing generator 512, the second reset end timing generator 514, and the third reset end timing generator 516 may only be activated in response to a respective one of the CASSYNC1, CASSYNC2, or CASSYNC3 commands type. In some examples the CASSYNC1 command may correspond to a write command, the CASSYNC2 command may correspond to a read command, and the CASSYNC3 command may correspond to a fast operation that includes a combination of write and read commands. The specified latency periods for the CASSYNC1, CASSYNC2, or CASSYNC3 commands types may be different. Thus, the first reset end timing generator 512, the second reset end timing generator 514, and the third reset end timing generator 516 may each provide a different end times. The latch 520 may latch the CASSYNC1, CASSYNC2, or CASSYNC3 commands in response to the T clock signal to provide a set signal SET to the 540. The 522 may receive outputs of each of the first reset end timing generator 512, the second reset end timing generator 514, and the third reset end timing generator 516 and may provide a reset signal RST based on values from each of the first reset end timing generator 512, the second reset end timing generator 514, and the third reset end timing generator 516 using NOR logic. In response to the RST signal, the 540 may latch the SET signal value at an output. The 550 may receive the output of the 540 and a MR latency signal. The 550 may provide a pulse on the RESET signal in response to the output of the latch 520 having a length based on the output of the respective one of the first reset end timing generator 512, the second reset end timing generator 514, or the third reset end timing generator 516 plus the delay of the 550. Thus, the duration of the pulse may be measured from a start time based on receipt of the output from the command decoder 510 and an end time (e.g., a time at which the pulse is terminated) based on a reset pulse end time setting provided via the respective one of the first reset end timing generator 512, the second reset end timing generator 514, or the third reset end timing generator 516 plus a latency through the 550 specified by the MR latency signal. The additional delay provided on the MR latency signal may be retrieved from a table of a mode register (e.g., the mode register 126 of FIG. 1) and may be based on a time period (e.g., or frequency) of a command clock signal. The reset pulse end time setting may be indicated as a number of the tCK cycles nCK of the command clock CK signal measured from the start time. In some examples, the reset pulse end time setting may include a set to values ranging from 0.5 nCK to 3.5 nCK. For example, if a maximum tCK of the command clock is 200 nanoseconds, then the reset pulse end time value may be set to 0.5 nCK. In another example, if the maximum tCK of the command clock is 1.67 nanoseconds, then the reset pulse end time value may be set to 3.5 nCK. Other nCK values and ranges may be used without departing from the scope of the disclosure. In some examples, the delay provided by the 550 may include an asynchronous delay. The asynchronous delay may include inverters or other components to provide the additional delay. The delay provided by the asynchronous delay circuit may mitigate effects of the asynchronous timing relationship between the command clock and write clocks on which timing of the T and N clock signals are based (e.g., the WCK_T and WCK_N clock signals of FIG. 1).

Figure 6:
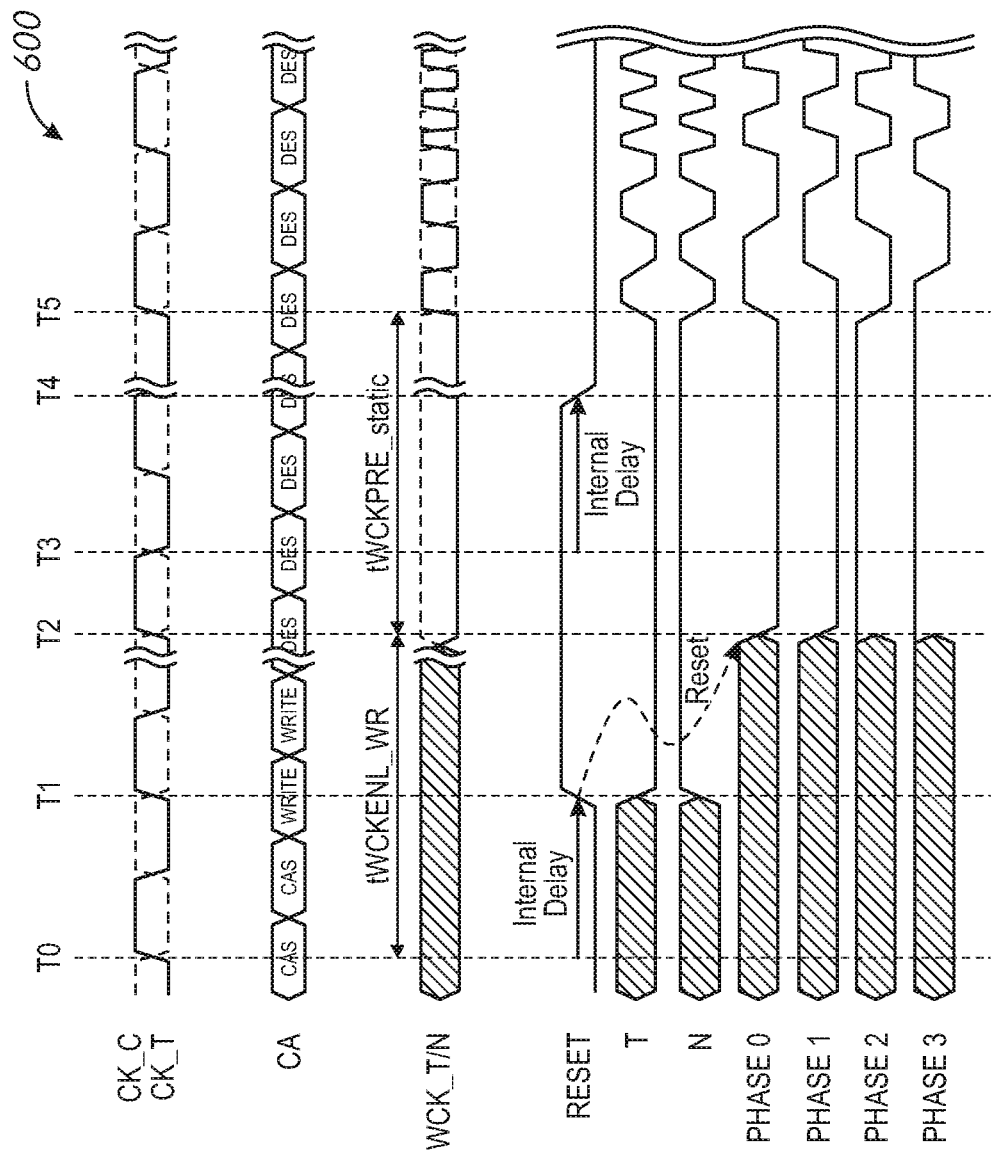
FIG. 6 is an illustration of an exemplary timing diagram depicting a reset operation of a divider circuit in accordance with embodiments of the disclosure.

FIG. 6 is an illustration of an exemplary timing diagram 600 depicting a reset operation of a divider circuit in accordance with embodiments of the disclosure. In some examples, the timing diagram 600 may depict operation of the semiconductor device 100 (e.g., the WCK input circuit 105 and/or the divider and buffer circuit 107) of FIG. 1, the divider and buffer circuit 200 of FIG. 2, the divider circuit 320 of FIG. 3, the buffer circuits 440(0)-(3) of FIGS. 4A-4D, the reset circuit 500 of FIG. 5, or combinations thereof. The CK_C and CK_T clock signals may correspond to command clock signals discussed with respect to FIGS. 1-3, such as the command clock signal used to clock the command and address bus 110 of FIG. 1. The CA and CMD signals may correspond to the C/A signals corresponding to commands received via the command and address bus 110, including the CAS SYNC command of FIGS. 1 and 2. The WCK_T and WCK_N may correspond to the WCK_T and WCK_N clock signals of FIG. 1. The RESET signal may correspond to the RESET signal of FIGS. 2 and 3 and the RESET and RESETF signals of FIGS. 4C-4D. The T and N clock signals may correspond to the T and N clock signals of FIGS. 1-4D. The PHASE 0-3 clock signals may correspond to the PHASE 0-3 clock signals of FIGS. 1-3.

At time T0, timing the CAS SYNC command may be received in response to the CK_C and CK_T clock signals via the CA and CMD signals. The reset operation may be initiated in response to receipt of the CAS SYNC command. A duration of the reset operation may be measured from time T0 to time T3. The reset operation end time may be based on the tCK of the CK_C and CK_T clock signals. In some examples, the reset end time may range from 0.5 to 3.5 nCK of the CK_C and CK_T clock signals. The CAS SYNC command may be processed between times T0 and time T1 via internal delays of circuitry decoding circuitry. At time T1, in response to the CAS SYNC command, the RESET signal may transition to a high logical value to start a reset pulse and the T and N clock signals may transition to low and high logical values, respectively. A length (e.g., duration) of the reset pulse on the RESET signal may be based on the reset operation start and end times, shifted by internal delays of the circuitry from receipt of the CAS SYNC command. Thus, the reset operation pulse on the RESET signal may start at time T1 and end at time T4. The duration of time from times T1 to T4 may be based on the duration of time from times T0 to T3. In some examples, the reset pulse may include an additional asynchronous delay (e.g., via the delay circuit 212 of FIG. 2) that extends a time at which the reset pulse is set to a duration longer than the duration from time T0 to time T3. Transition of the T and N clock signals may be performed by the WCK input circuit 105 of FIG. 1. The transition of the RESET signal may be performed by the divider and buffer circuit 107 of FIG. 1 and/or the reset circuit 210 of FIG. 2.

After transition latency within the divider circuit from time T1 to time T2, the PHASE 0-3 clock signals may transition to respective reset values in response to the RESET signal at time T2. For example, the PHASE 0 and PHASE 1 clock signals may transition to the low logical value and the PHASE 2 and PHASE 3 clock signals may transition to the high logical value. Transition of the PHASE 0-3 clock signals may be performed by the buffer circuits 340(0)-(3), respectively, of FIG. 3 and/or the buffer circuits 440(0)-(3) of FIGS. 4A-4D, respectively.

At time T4, the RESET signal transitions to the low logical value to end the reset pulse. At time T5, normal operation of the WK input circuit and the divider and buffer circuit may be initiated based on transitions of the WCK_T and WCK_N clock signals between high and low logical values. In response, the T and N clock signals may begin transitioning between high and low logical values (e.g., via the WCK input circuit 105). In response to transitions of the T and N clock signals, the PHASE 0-3 clock signals may transition between high and low logical values. By setting the PHASE 0-3 clock signals to known values during the reset operation, the divider circuit operating in a metastable state may be avoided upon restart of the WCK_T and WCK_N clock signals.

The timing diagram 600 is exemplary for illustrating operation of various described embodiments. Although the timing diagram 600 depicts a particular arrangement of signal transitions of the included signals, one of skill in the art will appreciate that additional or different transitions may be included in different scenarios without departing from the scope of the disclosure, including addition of delays between serially-related signals. Further, the depiction of a magnitude of the signals represented in the timing diagram 600 is not intended to be to scale, and the representative timing is an illustrative example of a timing characteristics.

Although this disclosure has been described in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosure. Thus, it is intended that the scope of at least some of the present disclosure herein disclosed should not be limited by the particular disclosed embodiments described above.

What is claimed is:

1. An apparatus, comprising:
    a first buffer circuit configured to receive complementary clock signals and a reset signal, wherein, in response to a pulse on the reset signal, the first buffer circuit is configured to provide a first divided clock signal having a first logical value, wherein, in response to completion of the pulse on the reset signal, the first buffer circuit is configured to provide the first divided clock signal based on respective logical values of the complementary clock signals;
    a second buffer circuit configured to receive the complementary clock signals and the reset signal, wherein, in response to the pulse on the reset signal, the second buffer circuit is configured to provide a second divided clock signal having a second logical value, wherein, in response to completion of the pulse on the reset signal, the second buffer circuit is configured to provide the second divided clock signal based on the respective logical values of the complementary clock signals; and
    a reset circuit configured to receive a column access strobe synchronization (CAS SYNC) command, wherein, in response to the command, the reset circuit is configured to provide the pulse on the reset signal, wherein the reset circuit is configured to determine a pulse end time based on a type of the CAS SYNC command.

2. The apparatus of claim 1, wherein the reset circuit is further configured to determine a duration of the pulse based on the pulse end time.

3. The apparatus of claim 1, wherein the first buffer circuit comprises:
    a first inverter configured to be enabled in response to the complementary clock signals having first respective logical values; and
    a second inverter configured to be enabled in response to the complementary clock signals having second respective logical values opposite the first respective logical values.

4. The apparatus of claim 3, wherein the second buffer circuit comprises:
    a third inverter configured to be enabled in response to the complementary clock signals having the second respective logical values; and
    a fourth inverter configured to be enabled in response to the complementary clock signals having the first respective logical values.

5. The apparatus of claim 1, Wherein the first buffer circuit is configured to provide the first divided clock signal based input on the second divided clock signal and the second buffer circuit is configured to provide the second divided clock signal based in part on the first divided clock signal.

6. The apparatus of claim 1, further comprising:
    a third buffer circuit configured to receive the complementary clock signals and the reset signal, wherein, in response to completion of the pulse on the reset signal, the third buffer circuit is configured to provide a third divided clock signal phase shifted relative to the first divided clock signal; and
    a fourth buffer circuit configured to receive the complementary clock signals and the reset signal, wherein, in response to completion of the pulse on the reset signal, the fourth buffer circuit is configured to provide a fourth divided clock signal phase shifted relative to the second divided clock signal.

7. The apparatus of claim 6, wherein the first, second, third, and fourth divided clock signals are all phase shifted 90 degrees relative to one another.

8. The apparatus of claim 1, further comprising a clock input circuit configured to provide the complementary clock signals based on external complementary clock signals.

9. The apparatus of claim 1, wherein the reset circuit configured to add an asynchronous delay to the pulse after the pulse end time.

10. A method, comprising:
    in response to receipt of a column access strobe synchronization (CAS SYNC) command:
        determining a pulse end time based on a type of the CAS SYNC command;
        providing a pulse on a reset signal; and
        receiving, at a first buffer circuit complementary clock signals and the reset signal; and
    in response to completion of the pulse on the reset signal:
        providing, via the first buffer circuit, a first divided clock signal having a first logical value based on respective logical values of the complementary clock signals;
        receiving, at a second buffer circuit, the complementary clock signals and the reset signal; and
        providing, via the second buffer circuit, a second divided clock signal having a second logical value based on respective logical values of the complementary clock signals.

11. The method of claim 10, further comprising determining a duration of the pulse on the reset signal based on the pulse end time.

12. The method of claim 10, further comprising:
enabling a first inverter of the first buffer circuit in response to the complementary clock signals having first respective logical values; and
enabling a second inverter of the first buffer circuit in response to the complementary clock signals having second respective logical values opposite the first respective logical values.

13. The method of claim 12, further comprising:
enabling a third inverter of the second buffer circuit in response to the complementary clock signals having the second respective logical values; and
enabling a fourth inverter of the second buffer circuit in response to the complementary clock signals having the first respective logical values.

14. The method of claim 10, further comprising providing, via the first buffer circuit, the first divided clock signal based in part on the second divided clock signal.

15. The method of claim 14, further comprising providing, via the second buffer circuit, the second divided clock signal based in part on the first divided clock signal.

16. The method of claim 10, further comprising:
providing, via a third buffer circuit, a third divided clock signal phase shifted relative to the first divided clock signal in response to a pulse on the reset signal; and
providing, via a fourth buffer circuit, a fourth divided clock signal phase shifted relative to the second divided clock signal in response to a pulse on the reset signal.

17. The method of claim 16, wherein the first, second, third, and fourth divided clock signals are all phase shifted 90 degrees relative to one another.

18. The method of claim 10, further comprising adding an asynchronous delay to the pulse after the pulse end time.

* * * * *

UNITED STATES PATENT AND TRADEMARK OFFICE
CERTIFICATE OF CORRECTION

PATENT NO. : 11,366,487 B2
APPLICATION NO. : 17/067247
DATED : June 21, 2022
INVENTOR(S) : Koji Ito It is certified that error appears in the above-identified patent and that said Letters Patent is hereby corrected as shown below:

In the Claims

| | Reads | Should Read |
|---|---|---|
| Column 18, Line 20 | "first divided clock signal based input on the second divided clock signal" | -- first divided clock signal based in part on the second divided clock signal -- |

Signed and Sealed this
Eleventh Day of April, 2023

Katherine Kelly Vidal
*Director of the United States Patent and Trademark Office*